(12) United States Patent  
Kim (10) Patent No.: US 7,554,850 B2
(45) Date of Patent: Jun. 30, 2009

(54) NONVOLATILE MEMORY DEVICE WITH LOAD-SUPPLYING WIRED-OR STRUCTURE AND AN ASSOCIATED DRIVING METHOD

(75) Inventor: Jong-Hwa Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 263 days.

(21) Appl. No.: 11/319,307

(22) Filed: Dec. 27, 2005

(65) Prior Publication Data

US 2006/0171212 A1  Aug. 3, 2006

(30) Foreign Application Priority Data

Jan. 4, 2005  (KR) ............... 10-2005-0000404

(51) Int. Cl.
G11C 16/26 (2006.01)
G11C 16/34 (2006.01)

(52) U.S. Cl. ................ 365/185.22; 365/185.25

(58) Field of Classification Search ........... 365/185.22, 365/189.05, 185.21, 189.08, 205, 185.25
See application file for complete search history.

(56) References Cited

U.S. PATENT DOCUMENTS

| 5,299,162 | A | * | 3/1994 | Kim et al. | ............... | 365/185.17 |
| 5,521,864 | A | * | 5/1996 | Kobayashi et al. | ..... | 365/185.22 |
| 5,793,696 | A | * | 8/1998 | Tanaka et al. | .......... | 365/230.06 |
| 6,798,697 | B2 | * | 9/2004 | Hosono et al. | ......... | 365/185.12 |
| 7,180,783 | B2 | * | 2/2007 | Kim et al. | ............... | 365/185.22 |
| 2006/0120172 | A1 | * | 6/2006 | Lee et al. | ................ | 365/189.05 |

FOREIGN PATENT DOCUMENTS

| JP | 11-203879 | 7/1999 |
| JP | 2002-140899 | 5/2002 |
| KR | 2002-0087168 | 11/2002 |

OTHER PUBLICATIONS

English language abstract of Korean Publication No. 2002-0087168.
English language abstract of Japanese Publication No. 11-203879.
English language abstract of Japanese Publication No. 2002-140899.

* cited by examiner

Primary Examiner—J. H. Hur
Assistant Examiner—Douglas King
(74) Attorney, Agent, or Firm—Marger Johnson & McCollom, P.C.

(57) ABSTRACT

We describe a nonvolatile memory device with a wired-OR structure and method of driving the same that reduces peak current during the wired-OR operation. The nonvolatile semiconductor memory device includes a memory cell array including a plurality of bitlines and a plurality of memory cells to store data. A plurality of page buffers buffer main latch data responsive to the bitlines. An internal output line operates in an output drive voltage responsive to the main latch data. A global output line transfers a data bit responsive to the internal output line. An output switch circuit electrically connects the global output line to the internal output line during a wired-OR operation. And a data line control circuit charges the global output line with a charge current after discharging the same during the wired-OR operation.

24 Claims, 13 Drawing Sheets

FIG. 13

NONVOLATILE MEMORY DEVICE WITH LOAD-SUPPLYING WIRED-OR STRUCTURE AND AN ASSOCIATED DRIVING METHOD

RELATED APPLICATIONS

This U.S. patent application claims priority under 35 U.S.C. § 119 to Korean Patent Application 2005-0000404 filed on Jan. 4, 2005, the contents of which we incorporate by reference.

BACKGROUND

The present invention relates to a nonvolatile semiconductor memory device and especially, to a nonvolatile memory device with wired-OR structure and an associated driving method.

Programming or reading data from memory cells in a nonvolatile semiconductor memory device typically requires controlling a bitline voltage corresponding to a selected memory cell. For controlling the bitline, the nonvolatile memory device embeds a page buffer to store the read out and/or program data bit.

Figure 1:
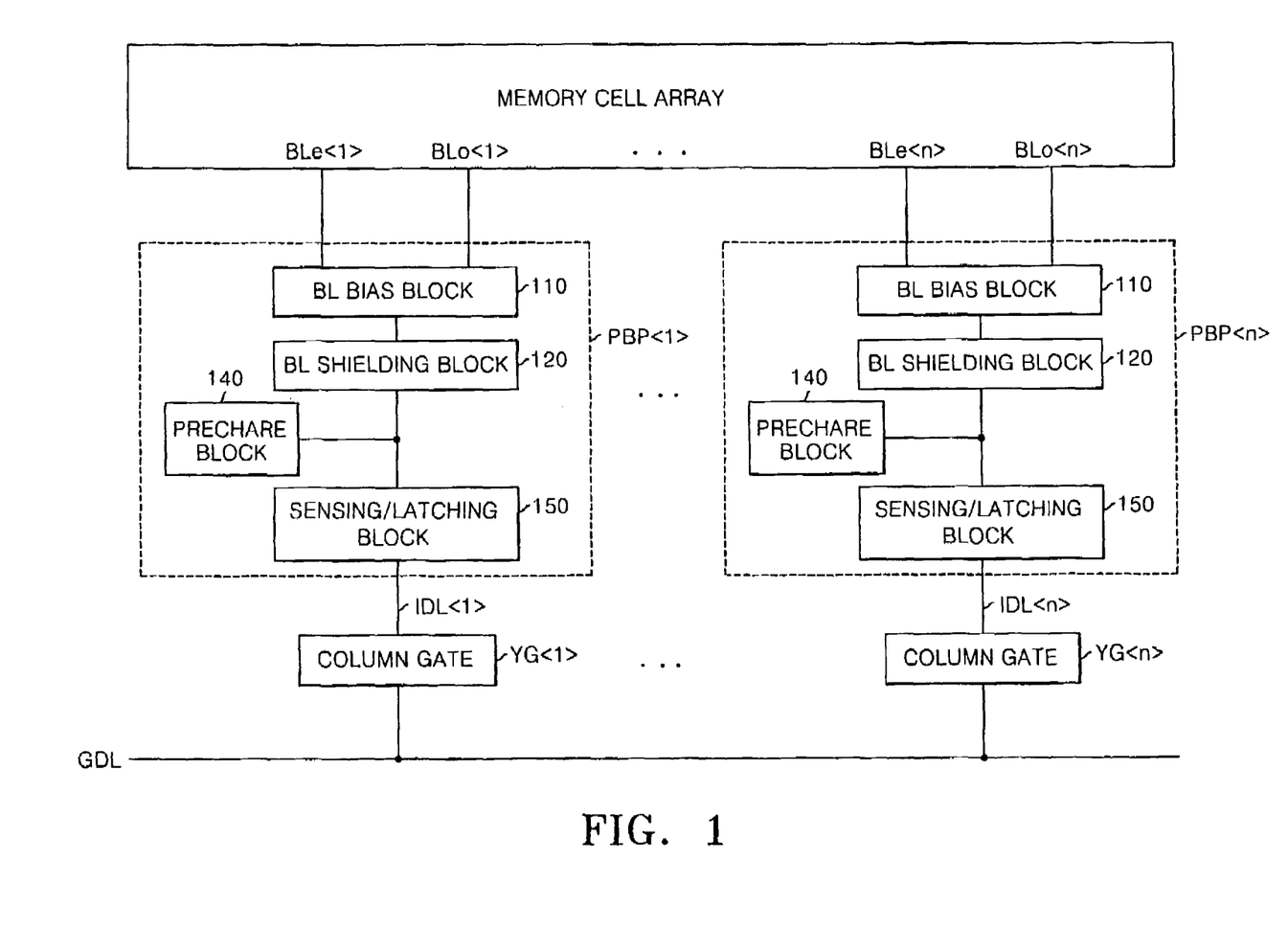
FIG. 1 is a block diagram of a conventional nonvolatile memory device.
Figure 2:
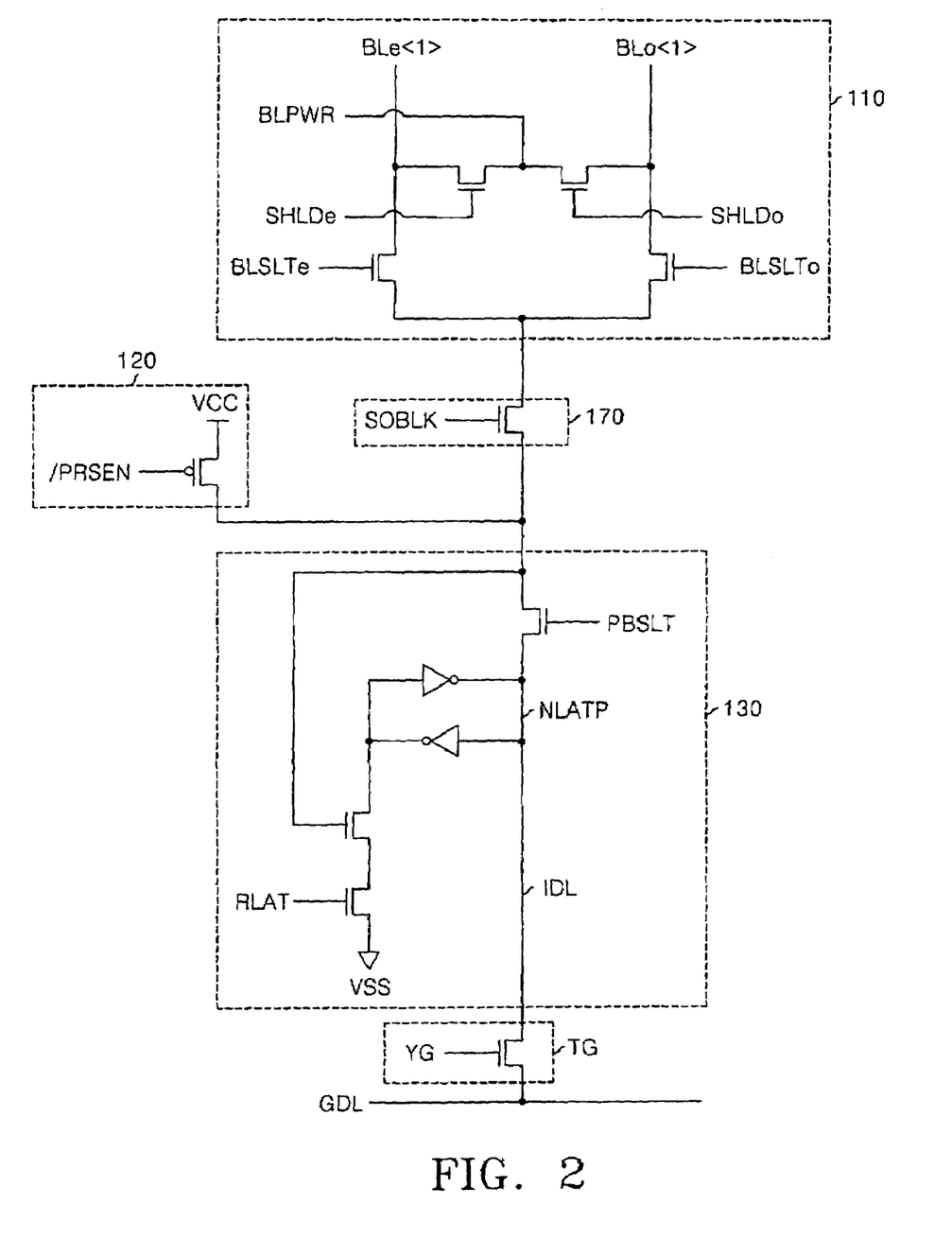
FIG. 2 is a circuit diagram of a column gate corresponding to one of page buffers shown in FIG. 1.

FIG. 1 is a block diagram of a conventional nonvolatile memory device including a page buffer PBF. FIG. 2 illustrates a column gate YG (one of YG<1>~YG<n>) corresponding to one of page buffers PBP (one of PBP<1>~PBP<n>) shown in FIG. 1. In the conventional page buffer PBP, a data bit written into a memory cell is loaded and stored in a sensing/latching block 150. The data bit held in the sensing/latching block 150 is transferred to a bitline BLe or BLo and programmed in a selected memory cell. A data bit corresponding to a data bit read out from a memory cell is also temporarily stored in the sensing/latching block 150. Responding to one of the column gating signals Ya<n:1>, the stored data bit stored is transferred to a global data line GDL.

In the conventional nonvolatile memory device, as shown in FIGS. 1 and 2, internal data lines IDL of the page buffers PBP are commonly connected to the global data line GDL through their corresponding column gates YG. The data path from the global data line GDL to a sensing/latching node NLATP is commonly used by a data bit during programming and reading operations. Data stored in the sensing/latching node NLATP may flip, change, or otherwise corrupt due to a charge sharing between the global data line GDL and the internal data line IDL.

A program verifying operation for the conventional nonvolatile memory device is conductive in a Y-scanning scheme if it serially or sequentially confirms each of the data bits in programmed memory cells. By contrast, a wired-OR scheme confirms, at one time, all the data bits in programmed memory cells. The conventional nonvolatile memory device therefore has an unnecessarily lengthy program data verifying operation.

Accordingly, a need remains for a non-volatile semiconductor memory device with a load-supplying wired-OR structure and an associated driving method.

SUMMARY

We describe a nonvolatile memory device with a wired-or structure that addresses the disadvantages associated with prior devices.

And we describe a method for driving a nonvolatile memory device with a wired-OR structure that addresses the disadvantages associated with prior methods.

A nonvolatile semiconductor memory device includes a memory cell array including a plurality of bitlines and a plurality of memory cells, each memory cell adapted to store data responsive to a corresponding bitline. A plurality of page buffers is each adapted to buffer main latch data responsive to the data in the bitlines. An internal output line is adapted to operate responsive to the main latch data stored in one of the page buffers regardless of the main latch data stored in others of the page buffers. An output switch circuit couples the internal output line to a global output line during a wired-OR operation. And a data line control circuit supplies a charge current to the global output line after discharging the global output line during the wired-OR operation.

A nonvolatile semiconductor memory device comprises a memory cell array including a plurality of bitlines and a plurality of memory cells to store data. A plurality of page buffers buffer main latch data responsive to the bitlines. An internal output line operates in an output drive voltage responsive to the main latch data. A global output line transfers a data bit responsive to the internal output line. An output switch circuit electrically connects the global output line to the internal output line during a wired-OR operation. And a data line control circuit charges the global output line with a charge current after discharging the same during the wired-OR operation.

A method of driving a nonvolatile semiconductor memory device comprising buffering main latch data responsive to data stored in a plurality of bitlines and driving an internal output line responsive to the main latch data. The method includes switching data from the internal to a global output line during a wired-OR operation and supplying a charge current to the global output line after discharging the global output line during the wired-OR operation. The method may also include discharging the global output line to a ground voltage and supplying the charge current to the global output line for a predetermined time after discharging.

BRIEF DRAWING DESCRIPTION

We include the accompanying drawings to provide an understanding of the device and method we describe below. The drawings illustrate example embodiments.

DETAILED DESCRIPTION

We describe preferred embodiments in detail with reference to the accompanying drawings. The present may, however, be embodied in different forms and should not be construed as limited to the embodiments set forth here. We provide these embodiments so that this disclosure will be thorough and complete, and will fully convey the scope we intend to those skilled in the art. Like numerals refer to like elements throughout the specification.

We describe a structure where two adjacent bitlines form a pair of bitlines. The present invention may, however, be embodied in a structure where each bitline is selected by its corresponding column address, as well as a structure with a bitline pair. In this description, the bitline may be referred to just as "bitline" without differentiating adjacent bitlines or even and odd bitlines.

Figure 3:
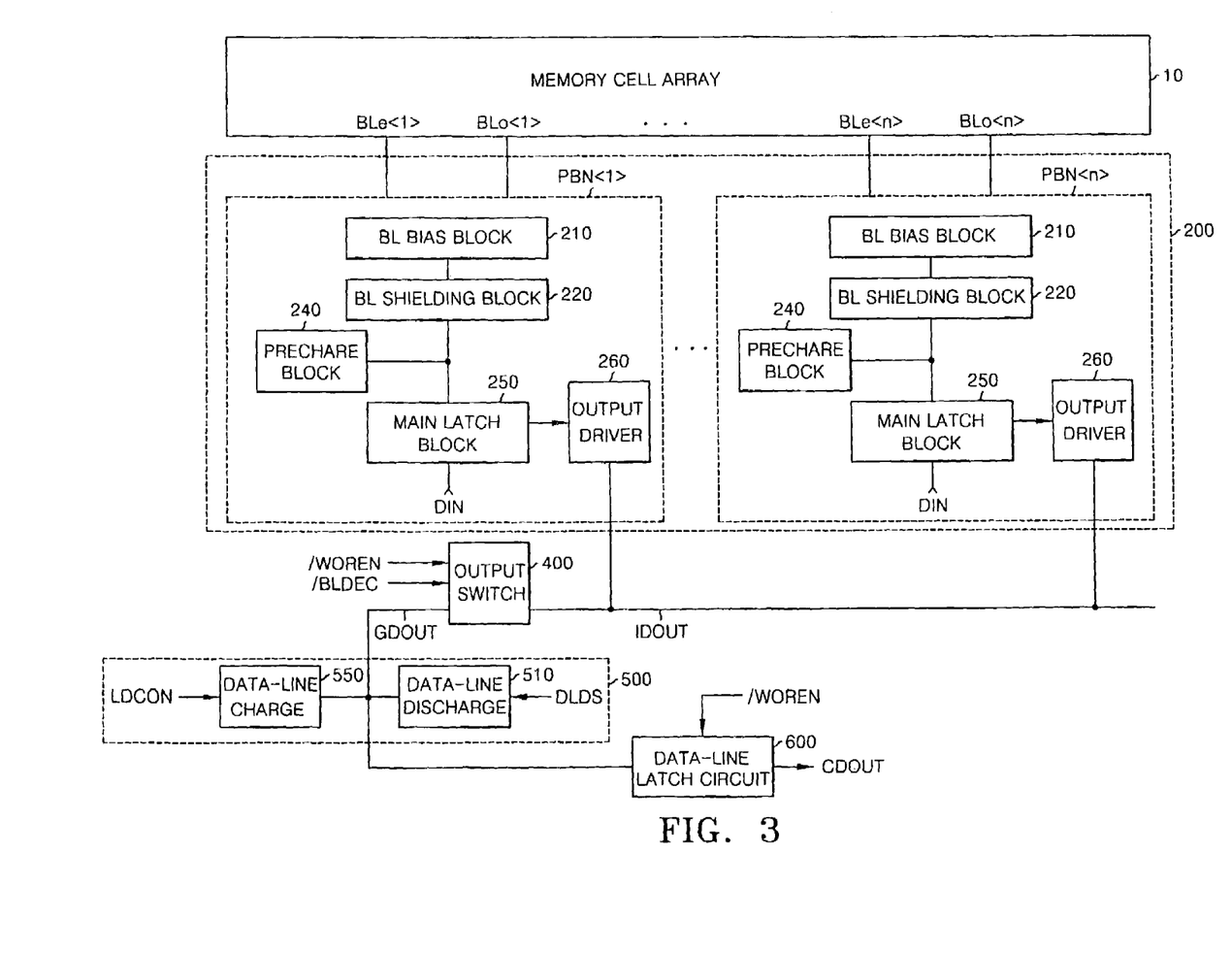
FIG. 3 is a block diagram of an embodiment of a nonvolatile memory device.

FIG. 3 illustrates a nonvolatile semiconductor memory device. Referring to FIG. 3, the nonvolatile semiconductor memory device comprises a memory cell array 10, a page buffer circuit 200, an output switch circuit 400, a data line control circuit 500, and a data line latch circuit 600.

The memory cell array 10 includes a plurality of even bitlines BLe<n:1>, and a plurality of odd bitlines BLo<n:1>. Together they form corresponding pairs of even and odd bitlines. The cell array 10 includes a plurality of memory cells for storing data by program operations in correspondence with the even and odd bitlines BLe<n:1> and BLo<n:1>. The memory cell array 10 is shown in more detail in FIG. 4.

Figure 4:
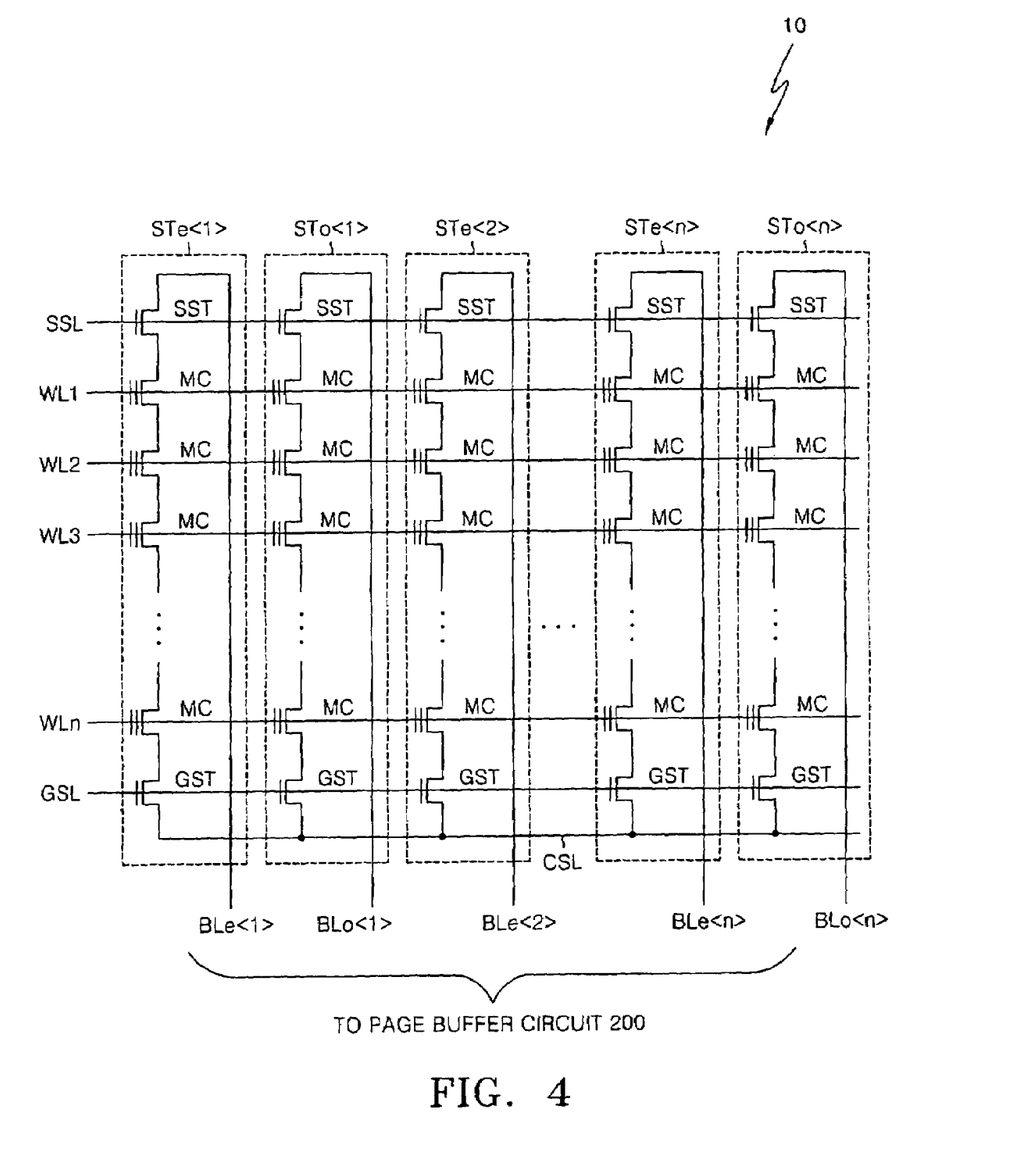
FIG. 4 is a circuit diagram of the memory cell array shown in FIG. 3.

Referring to FIG. 4, the memory cell array 10 comprises pluralities of even and odd cell strings STe<n:1> and STo<n:1> each connected to their corresponding bitlines even and odd BLe and BLo. Each cell string, in turn, includes a string selection transistor SST, a ground selection transistor GST connected to a common source line CSL, and memory cells MC serially connected between the string selection transistor SST and the ground selection transistor GST. And the bitlines BLe<n:1> and BLo<n:1> are electrically connected to the page buffer circuit 200.

Each of the memory cells MC is formed of a floating gate transistor constructed of a source, a drain, a floating gate, and a control gate. The ways to program the memory cell MC is by taking advantage of the channel hot electron effect (CHE) or Fowler-Nordheim tunneling (F—N), corresponding to a voltage level of the bitline assigned thereto among the plurality of even and odd bitlines BLe<n:1> and BLo<n:1>.

Returning to FIG. 3, the page buffer circuit 200 comprises a plurality of page buffers PBN<n:1> arranged corresponding to pairs of even ad odd bitlines BLe<n:1> and BLo<n:1>. All page buffers in the plurality 200 are constructed in the same or similar structure, but are coupled to corresponding even and odd bitline pair of BLe<n:1> and BLo<n:1>. Thus, in this specification, we will be describing a single page buffer with the reference numeral PBN as a representative without differentiating its order of arrangement, as is also for the bitline pairs of BLe<n:1> and BLo<n:1>.

Figure 5:
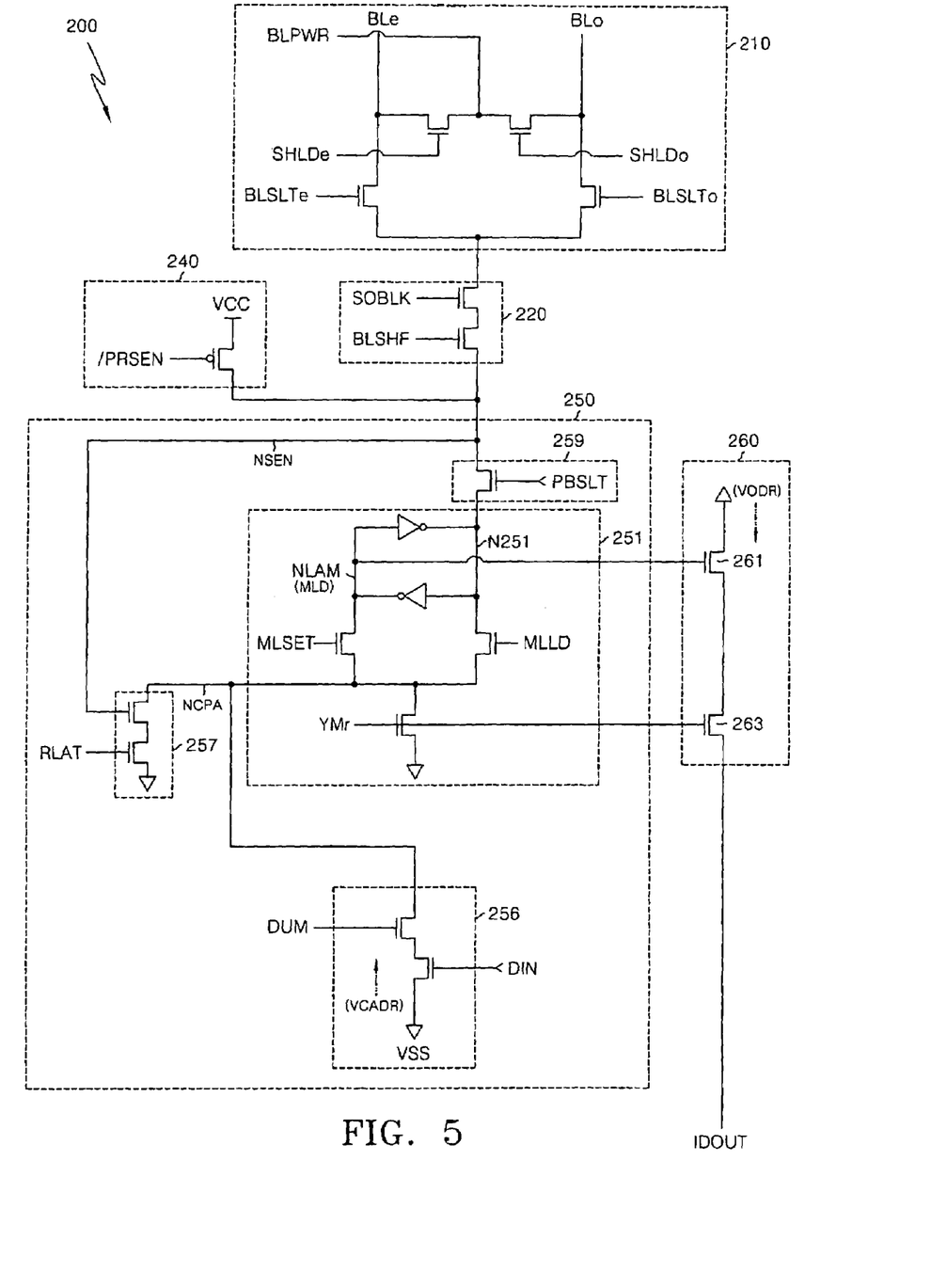
FIG. 5 is a circuit diagram of the page buffer shown in FIG. 3.

FIG. 5 is a circuit diagram of the page buffer PBN 200 shown in FIG. 3. The page buffer PBN stores a data bit that is transceived with the bitline pair BLe and BLo corresponding thereto, at a main latch node NLAM. In this specification we will refer to a data bit held at the main latch node NLAM as the main latch data bit MLD. Referring to FIG. 5, the page buffer PBN comprises a bitline bias block 210, a bitline shielding block 220, a precharge block 240, a main latch block 250, and an output driver 260.

The bitline bias block 210 selects an alternative one of two bitlines BLe and BLo forming its corresponding bitline pair, controlling a bias voltage thereof. The bitline shielding block 220 controls connection between the selected bitline BLe or BLo and a sensing node NSEN. The precharge block 240 preliminarily charges the sensing node NSEN of the main latch block 250 up to a power source voltage responsive to a sensing precharge signal /PRSEN.

The structure and operation of the bitline bias block 210, the bitline shielding block 220, and the precharge block 240 may be understood by those skilled in the art with reference to FIG. 5. We will not discuss these blocks in any more detail.

The main latch block 250 comprises the main latch node NLAM. The main latch data bit MLD stored at the main latch node NLAM may be supplied in various ways. In this embodiment, a logical state of the main latch data MLD depends on a voltage of a responding transfer node NCPA during a data program mode. The voltage of the responding transfer mode NCPA is conditioned by a cache latch data bit CLD having a logical state corresponding to an input data bit. As a result, a logical state of the main latch data bit MLD is determined by reflecting an input data thereto during the data program mode.

To summarize, when the selected bitline BLe or BLo is in a programmable state, i.e., a ground voltage VSS, the main latch data bit MLD is set on logic "H." Otherwise, when the selected bitline BLe or BLo is in a program-inhibit state, the main latch data bit MLD is set on logic "L."

The output driver 260 controls an internal output line IDOUT be driven in a unidirectional transfer operation in correspondence to the main latch data bit MLD. In other words, the internal output line IDOUT is driven into an output drive voltage VODR (the ground voltage VSS in this embodiment) by the main latch data MLD having a logic "H."

And the internal output line IDOUT is provided externally by way of the output switch circuit 400 of FIG. 3. The internal output line IDOUT is electrically isolated from an external transfer route of an input data bit to the main latch node NLAM. Thus, a logic state of the main latch data bit MLD is independent of variations of a voltage level on the internal output line IDOUT.

In more detail, the internal output line IDOUT is driven by the main latch data bit MLD of each of the page buffers PBN<n:1> of FIG. 3. If one of the main latch data bits MLD from the page buffers PBN<n:1> has a predetermined logical state (e.g., a logic "H"), the internal output line IDOUT, which is provided to a global output line GDOUT, is conductive with the output drive voltage VODR even when all logic states of the rest of the main latch data bits MLD from the page buffers PBN<n:1), except the selected one, are at a logic "L."

Therefore, the present invention makes it possible to implement a wired-OR structure by the output driver 260 in the nonvolatile semiconductor memory device including the page buffers PBN<n:1>. In other words, by executing a verifying operation simultaneously using the main latch data bits MLD, it is possible to determine whether memory cells connected to the plural page buffers PBN<n:1> have been successfully programmed. And the time consumed in verifying a program state is remarkably reduced.

Referring back to FIG. 5, we will describe in detail the main latch block 250 and the output driver 260.

The main latch block 250 comprises the sensing node NSEN, a main latch circuit 251, a cache dumping circuit 256, a sense responding circuit 257, and a buffer selection circuit 259. The sensing node NSEN is electrically coupled to a selected bitline BLe or BLo through the bitline shielding block 220.

The main latch circuit 251 includes the main latch node NLAM. The main latch node NLAM stores a data bit as the main latch data bit MID in correspondence with a logic state of the responding transfer node NCPA.

The cache dumping circuit 256 responds to a predetermined dumping control signal DUM, applying a cache drive voltage VCADR to the responding transfer node NCPA according to the cache latch data CLD.

The sense responding circuit 257 responds to a logical state of the sensing node NSEN and a predetermined logic state of a read latch signal RLAT, providing a sense responding voltage (i.e., the ground voltage VSS in this embodiment) to the sense responding node NCPA. The buffer selection circuit 259 transfers a data bit to the selected bitline BLe or BLo by way of the sensing node NSEN in correspondence with the main latch data bit MLD.

On the other hand, the output driver 260 activates the internal output line IDOUT in correspondence with the main latch data bit MLD during a data read mode. Preferably, the output driver 260 comprises a first output driving transistor 261 and a second output driving transistor 263. The first output driving transistor 261 is gated by the main latch data bit MLD. In other words, the first output driving transistor 261 is turned on when the main latch data bit MLD is at a logic "H." The second output driving transistor 263 is gated by a main latch selection address YMr, driving the internal output line IDOUT into the ground voltage VSS.

Thus, when the main latch data bit MLD has a logic "H," the internal output line IDOUT is driven into the ground voltage VSS when the main latch selection address YMr transitions to logic "H."

Returning to FIG. 3, the nonvolatile semiconductor memory device of the present invention also comprises an output switch circuit 400. The output switch circuit 400 connects the internal output IDOUT with the global output line GDOUT, responsive to a wired-OR enable signal WOREN and a block decoding signal /BLDEC. Here, the wired-OR enable signal /WOREN is active in logic "L" during a wired-OR operation that confirms all data supplied from the page buffers are sequentially connected to the internal output line IDOUT. And the block decoding signal /BLDEC is a signal specifying the internal output line IDOUT. In other words, the block decoding signal /BLDEC is an address signal designating the page buffers connected to the internal output line IDOUT in the page buffer circuit 200 of FIG. 3.

The output switch circuit 400, therefore, electrically connects the internal output line IDOUT to the global output line GDOUT during the wired-OR mode or when the page buffer circuit 200 is selected by the block decoding signal /BLDEC.

Figure 6:
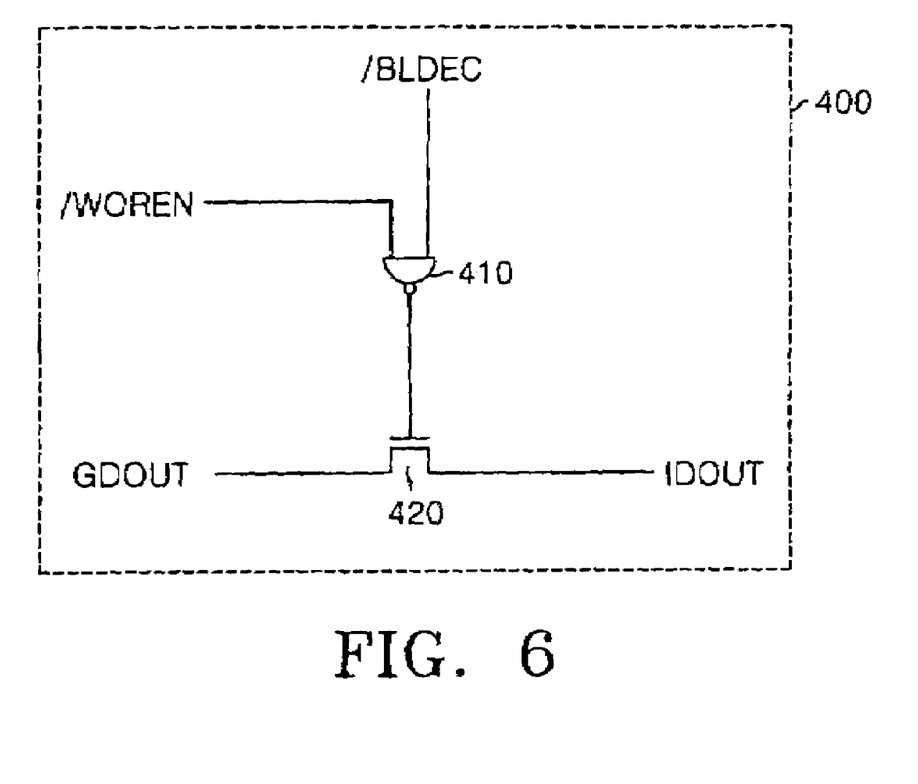
FIG. 6 is a circuit diagram of the output switch shown in FIG. 3.

FIG. 6 illustrates the output switch circuit 400 of FIG. 3 in detail. Referring to FIG. 6, the output switch circuit 400 comprises a switch logic gate 410 and a switch transistor 420. The switch logic gate 410 logically manipulates the block decoding signal /BLDEC and the wired-OR enable signal /WOREN, generating a switch control signal SW that controls the switch transistor 420.

In an embodiment, the switch transistor 420 transfers a data bit from the internal output line IDOUT to the global output line GDOUT when the block decoding signal /BLDEC or the wired-OR enable signal /WOREN is activated with logic "L."

Returning to FIG. 3, the nonvolatile semiconductor memory device of the present invention comprises a data line control circuit 500. The data line control circuit 500 charges a current (i.e., 'a charge current') at the global output line GDOUT for a constant time, after discharging the global output line GDOUT, in the wired-OR mode.

Figure 7:
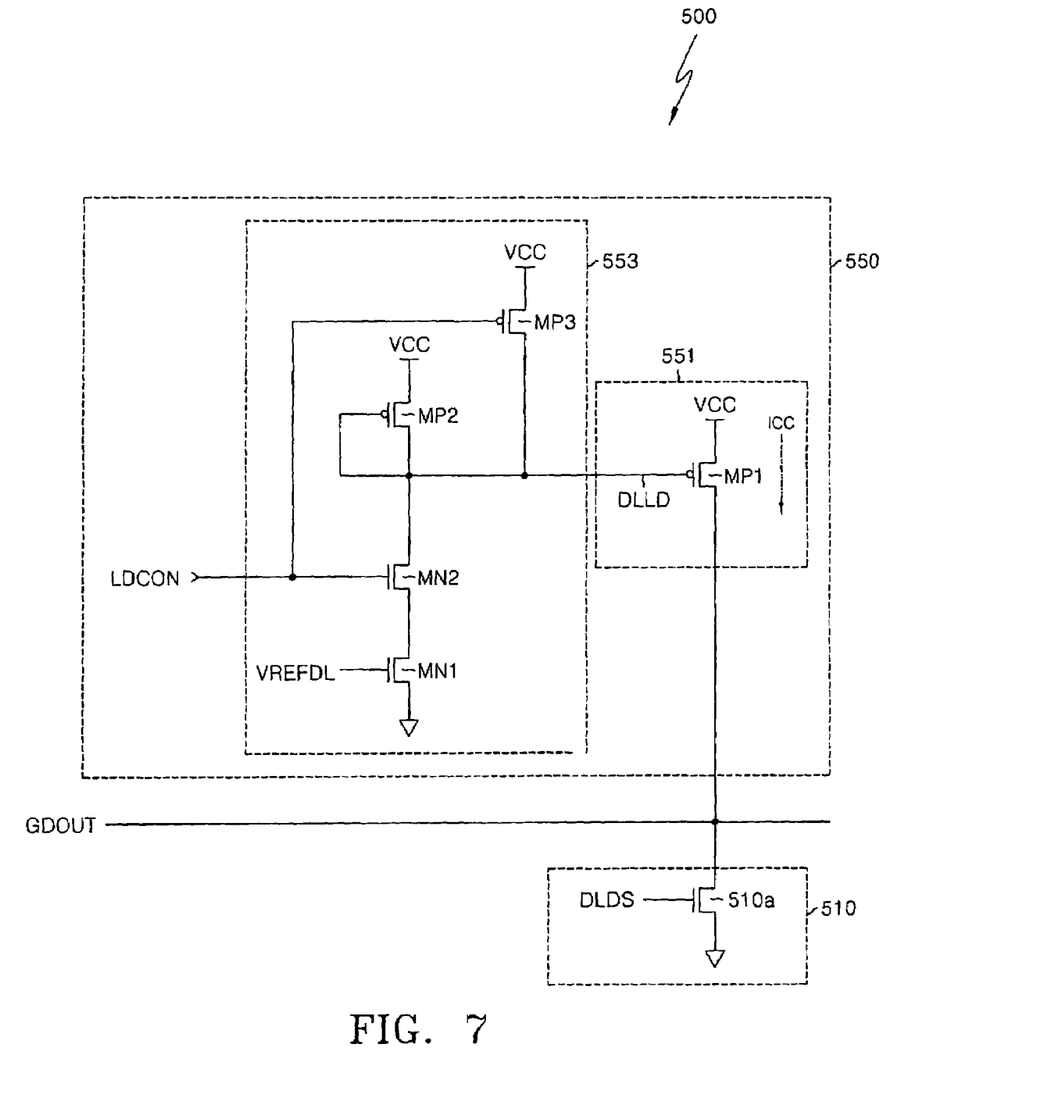
FIG. 7 is a circuit diagram of the data line control circuit shown in FIG. 3.
Figure 8:
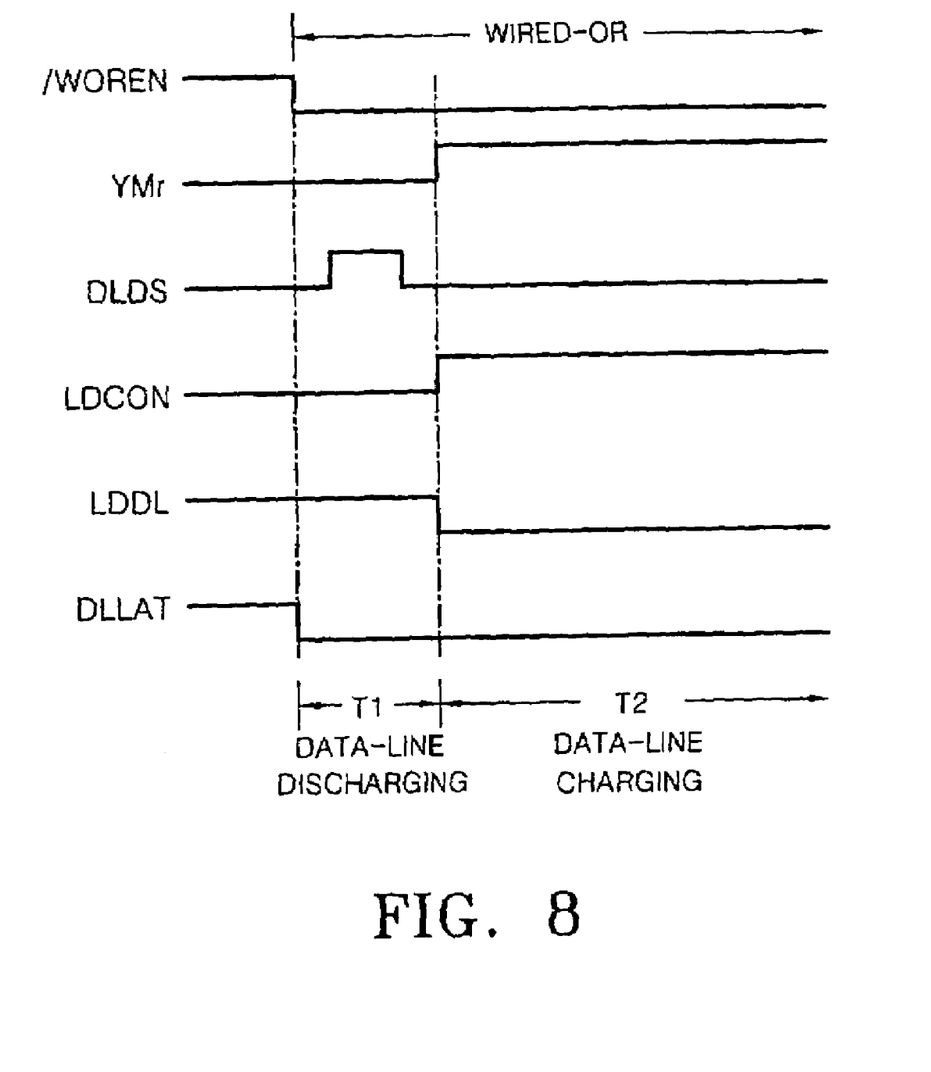
FIG. 8 is a timing diagram of signals and voltages at nodes in the data line control circuit of FIG. 7.

FIG. 7 illustrates the data line control circuit 500 of FIG. 3. FIG. 8 is a timing diagram illustrating waveforms of voltages at the nodes and signals, showing an operational sequence in the wired-ORing mode. Referring to FIG. 7, the data line control circuit 500 comprises a data line discharge block 510 and a data line charge block 550.

The data line discharge block 510 discharges the global output line GDOUT to the ground voltage VSS for the wired-OR mode. Preferably, the data line discharge block 510 comprises an NMOS transistor 510a for discharging the global output line GDOUT responsive to a data line discharge signal DLDs.

Meanwhile, the data line discharge signal DLDs is at a logic "H" during a data line discharge period T1 shown in FIG. 8. The global output line GDOUT is discharged to the ground voltage VSS in the data line discharge period T1.

Returning to FIG. 7, the data line charge block 550 charges up the global output line GDOUT, before conducting the wired-OR operation, after it has been discharged by the data line discharge block 510.

The data line charge block 550 comprises a data line charger 551 and a charge controller 553. The data line charger 551 operates responsive to a data line charge signal DLLD.

The data line charge signal DLLD is regulated on logic "L" during a data line charge period T2 shown in FIG. 8, supplying the charge current ICC to the data line charger 551.

The data line charger 551 may comprise a first PMOS transistor MP1 gated by the data line charge signal DLLD. The charge current ICC flows into the global output line GDOUT through the first PMOS transistor MP1.

The charge controller 553 provides the data line charge signal DLLD. The charge controller 553 comprises a second PMOS transistor MP2 and a first NMOS transistor MN1. The second PMOS transistor MP2 is a diode-coupled transistor connected between the power source voltage VCC and the data line charge signal DLLD, being gated by the data line charge signal DLLD.

The first NMOS transistor MN1 is connected between the data line charge signal DLLD and the ground voltage VSS, being gated by a data line reference voltage VREFDL. The first NMOS transistor MN1 also acts as a current source supplying a constant current flow.

As such, by the second PMOS transistor MP2 with diode-coupling connection and the fist NMOS transistor as a current source, the charge current ICC supplied to the global output line GDOUT is maintained on a constant level regardless of variations in processing conditions, as described below.

First, it is assumed that the electrical conductivity of the first PMOS transistor MP1 of the data line charger 551 is lower due to processing condition variations. In this case, the electrical conductivity of the second PMOS transistor MP2 of the charge controller 553 is also lower. Thus, a voltage level of the data line charge signal DLLD lowers to compensate the charge current ICC supply.

And assuming that the electrical conductivity of the second PMOS transistor MP2 is strong, the electrical conductivity of the first PMOS transistor MP1 is also strong. Therefore, an increase in a voltage level of the data line charge signal DLLD reduces the supply of the charge current ICC.

Accordingly, the charge current ICC supplied by the first PMOS transistor MP1 becomes insensitive to process condition variations.

The charge controller 553 further comprises a second NMOS transistor MN2 and a third PMOS transistor MP3 gated by a charge control signal LDCON.

The second NMOS transistor MN2 is serially connected between the data line charge signal DLLD and the ground voltage VSS through the first NMOS transistor MN1. Thus, the second NMOS transistor MN2 cuts off a current path of the charge controller 553 when the charge control signal LDCON is at a logic "L" (i.e., in the period exclusive of the wired-OR operation as shown in FIG. 8).

And the third PMOS transistor MP3 provides a VCC voltage level to the data line charge signal DLLD when the charge control signal LDCON is at a logic "L," interrupting the supply of the charge current ICC into the global output line GDOUT.

The wired-OR operation first proceeds in a discharge period T1 to discharge the global output line GDOUT to the ground voltage VSS. During data line charge period T2, for the charge current ICC is continuously supplied for a predetermined time, into a discharged global output line GDOUT.

Put differently, the wired-OR operation recharges the global output line GDOUT corresponding to the main latch data bit MLD of the main latch block 250 shown in FIG. 5 after discharging the global data line GDOUT (in this embodiment, referred to as 'load supply scheme'). As such, the wired-OR operation contributes to reducing peak currents therein.

Returning to FIG. 3, the nonvolatile semiconductor memory device of the present invention also includes the data line latch circuit 600. The data line latch circuit 600 temporarily stores a data bit of the global output line GDOUT and transfers the data bit to a common output line CDOUT from the global output line GDOUT.

Figure 9:
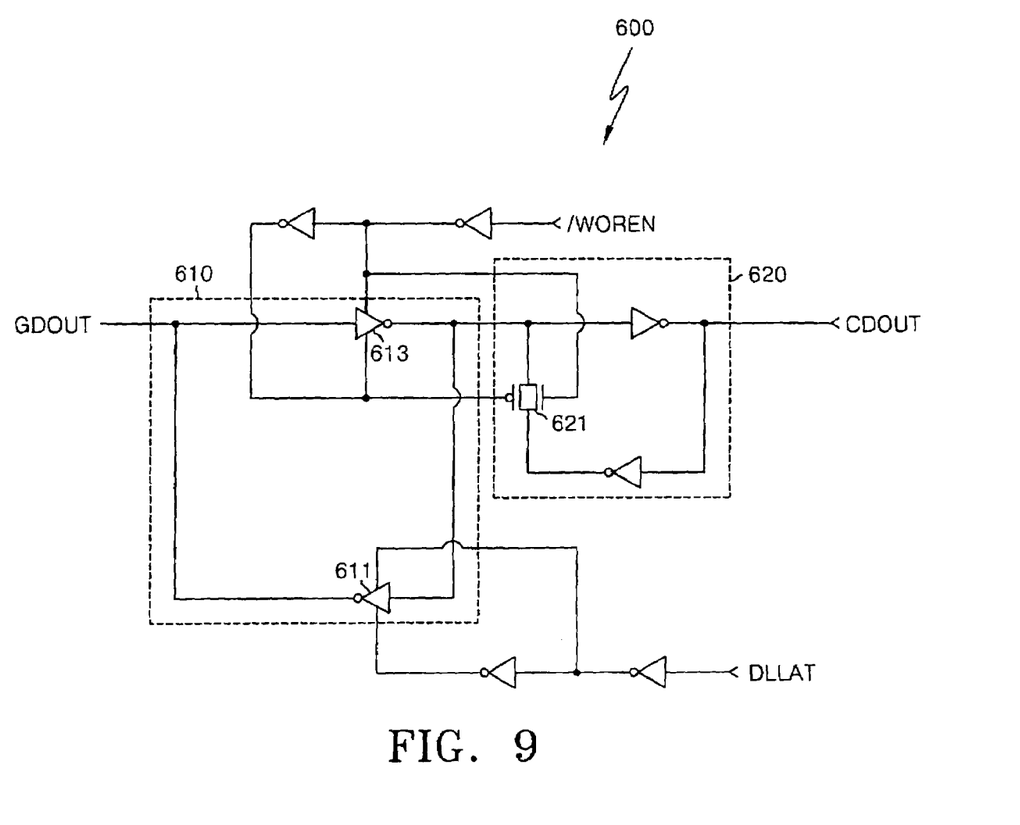
FIG. 9 is a detailed circuit diagram of the data latch circuit shown in FIG. 3.

FIG. 9 illustrates the data line latch circuit 600 of FIG. 3 in detail. Referring to FIG. 9, the data line latch circuit 600 comprises a global-line latch block 610 and a common latch block 620.

The global-line latch block 610 holds (or latches) a data bit of the global output line GDOUT responsive to a data latch signal DLLAT. The data latch signal DLLAT is at a logic "L" during the wired-OR mode. An inverter 611 is disabled to release the latching state for the global output line GDOUT. Further, the global-line latch block 610 transfers a data bit from the global output line GDOUT to the common output line CDOUT responsive to the wired-OR enable signal /WOREN. The wired-OR enable signal /WOREN is set on logic "L" in the wired-OR period. At this time, an inverter 613 is disabled to cut off the transfer of data toward the common output line CDOUT.

The common latch block 620 temporarily stores (or latches) a data bit of the common output line CDOUT responsive to the wired-OR enable signal /WOREN. A transfer gate 621 is turned on during the wired-OR period. At this time, the common latch block 620 is enabled to latch a data bit of the common output line CDOUT.

We turn now to describe a program verifying operation in the nonvolatile semiconductor memory device.

Figure 10:
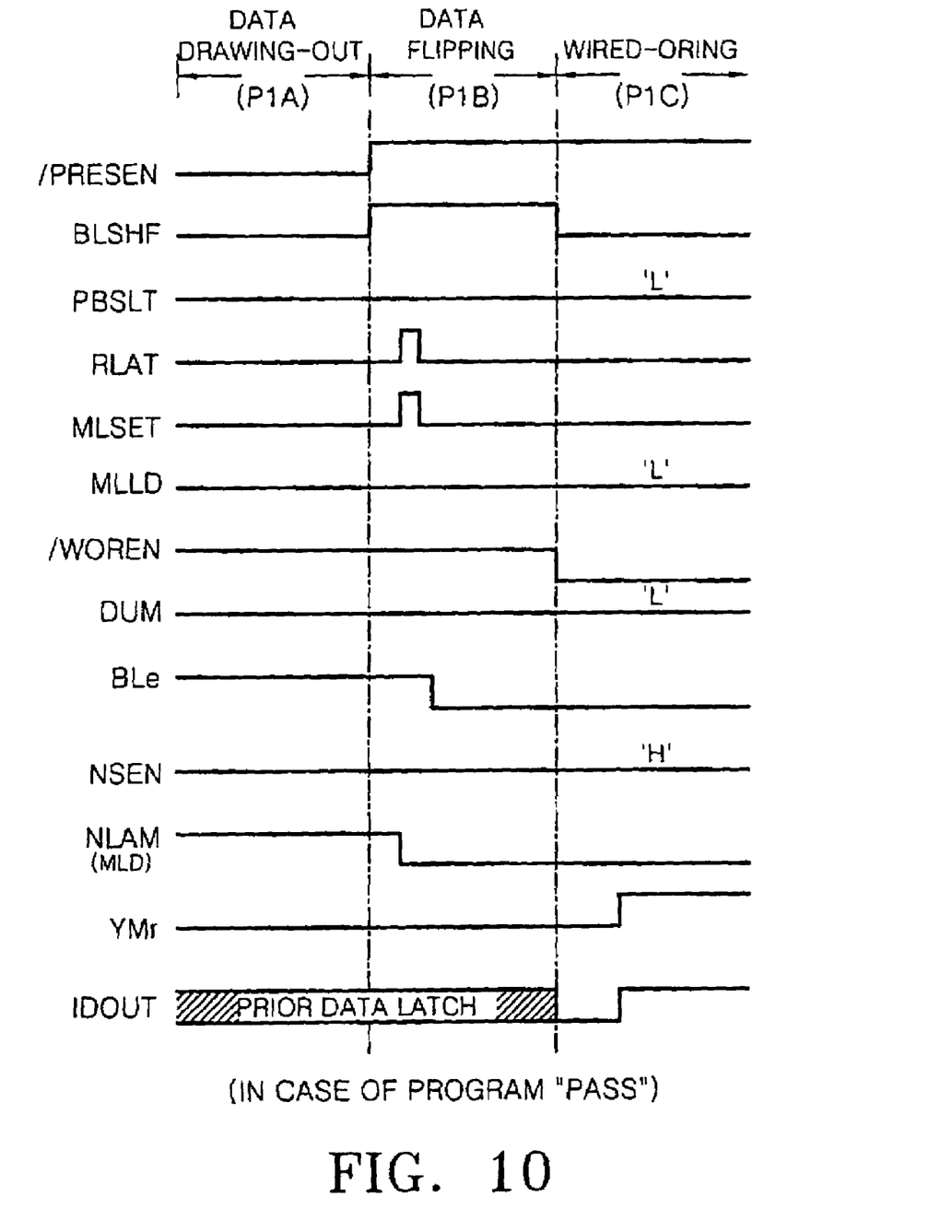
FIG. 10 is a timing diagram of "PASS" signals and voltage at nodes in a program verifying operation.
Figure 11:
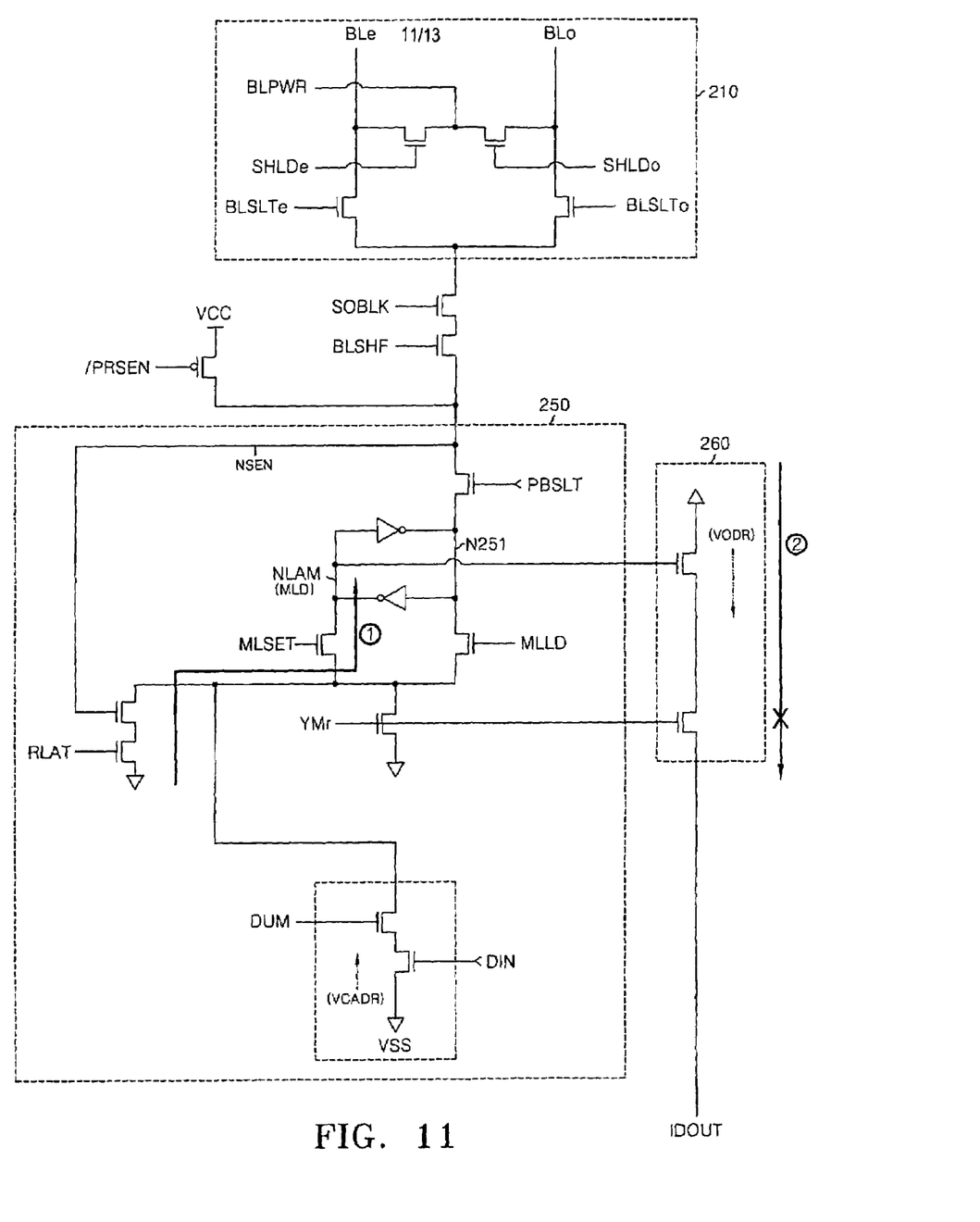
FIG. 11 is a circuit diagram of the data flow during the program verifying operation shown in FIG. 10.

FIG. 10 is a timing diagram showing waveforms of signals and voltages at the nodes during the program verifying operation when a selected memory cell is detected as being successfully programmed (i.e., 'PASS'). FIG. 11 illustrates a data flow in accordance with the verifying operation shown in FIG. 10. Referring to FIG. 10, in a data drawing-out period P1A, a sensing precharge signal /PRSEN goes to a logic "L" to precharge the sensing node NSEN to the power source voltage VCC. During this time, the main latch data bit MLD has a logic "H." As a selected memory cell is conditioned in the PASS program state, the corresponding bitline BLe or BLo is maintained at its current state.

In a data flipping period P1B, even when the bitline shielding signal BLSHF changes to a logic "H," the sensing node NSEN almost keeps the level of the power source voltage VCC. If the read latch signal RLAT and main latch setting signal MLSET become logic "H," the main latch node NLAM flips to a logic "L" from a logic "H" (refer to ① shown in FIG. 11). Thereafter, even if a node N251 goes to logic "L," the internal output line IDOUT is not driven into the ground voltage VSS (refer to ② shown in FIG. 11).

In the wired-OR period P1C, the wired-OR enable signal /WOREN is set to a logic "L." During this time, even if the global output line GDOUT is connected to the internal output line IDOUT, the global output line GDOUT transitions to a charged state of logic "H" from a discharged state of logic "L." As such, from finding the global output line GDOUT is laid on a logic "H," it verifies that all memory cells MC to be programmed have been successfully programmed as being in the PASS state.

Figure 12:
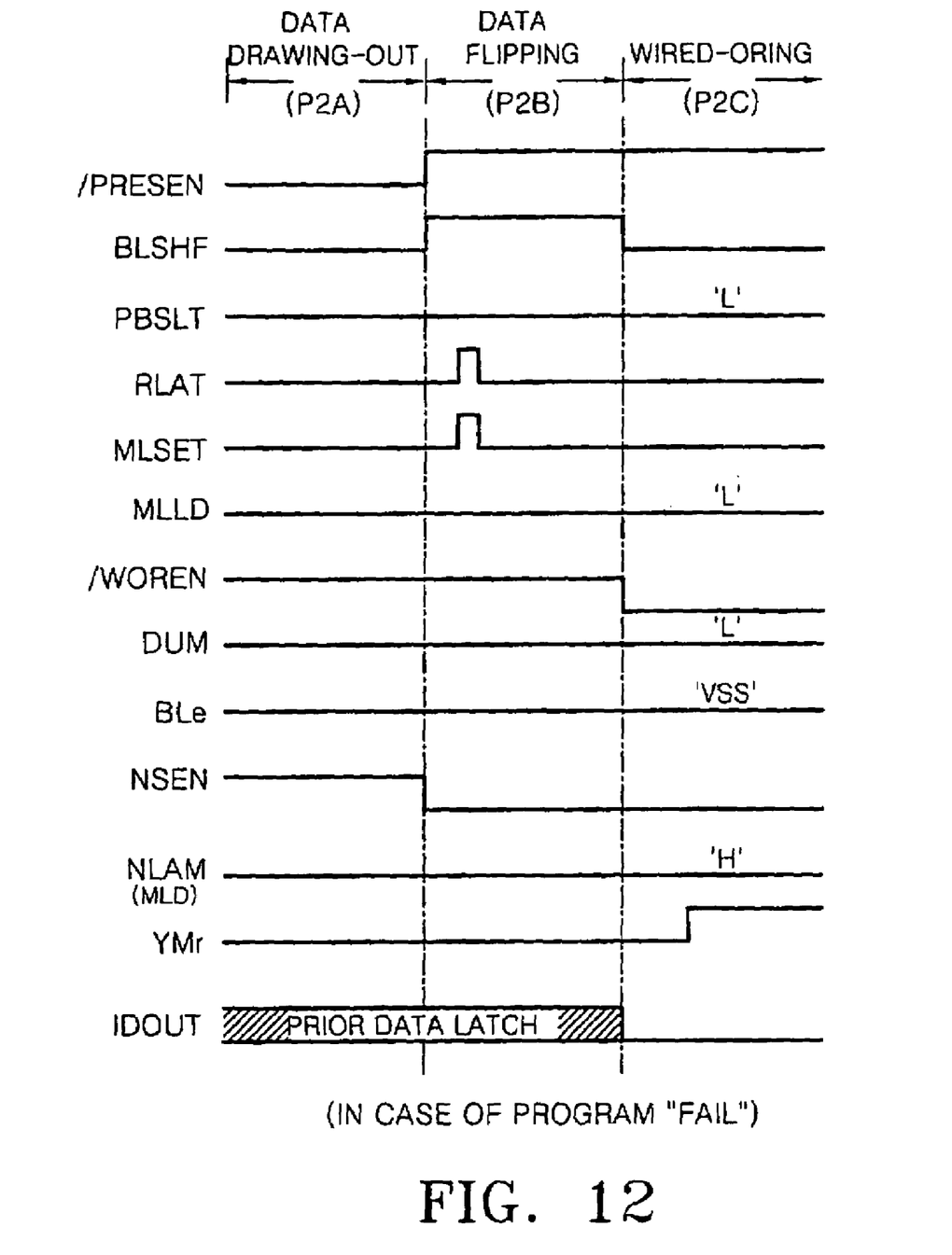
FIG. 12 is a timing diagram of "FAIL" signals and voltage at nodes in a program verifying operation.
Figure 13:
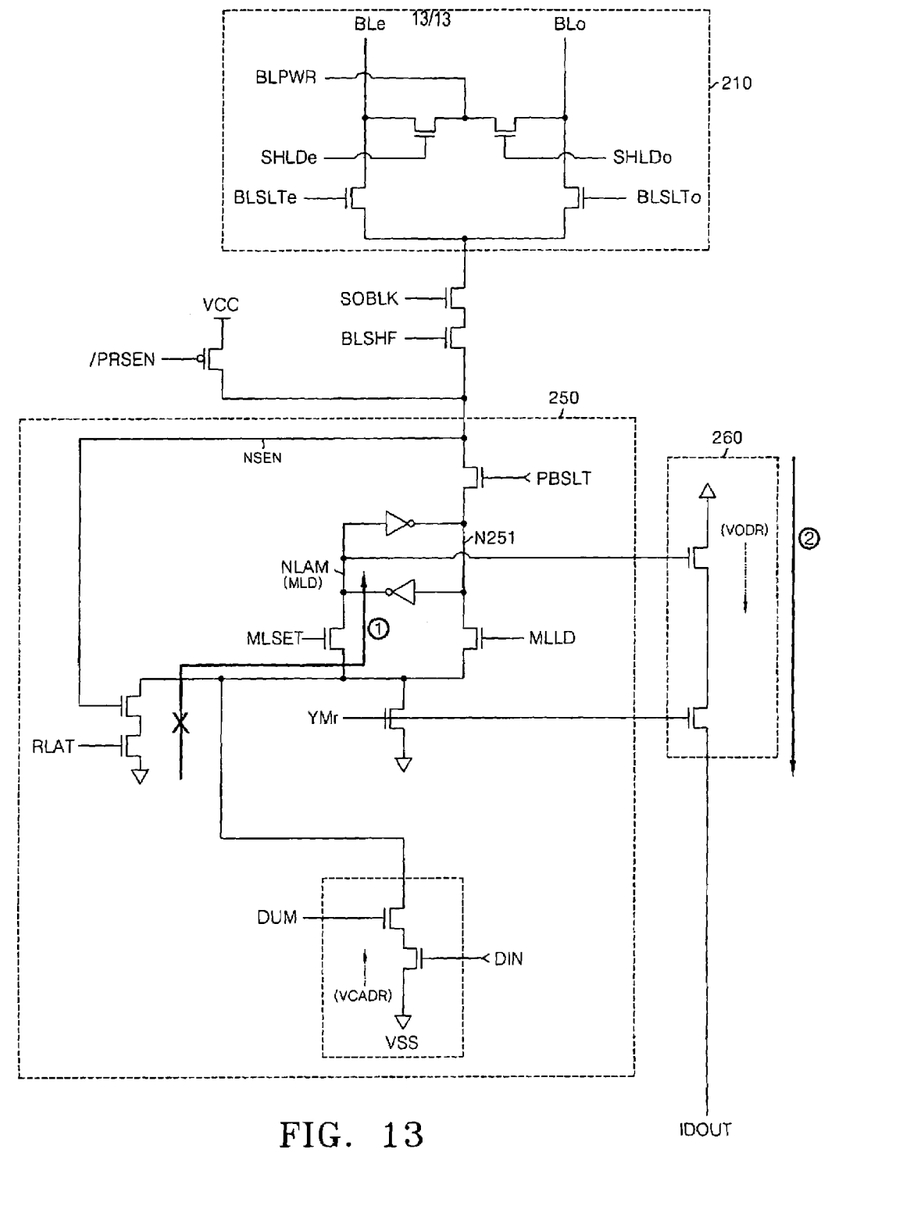
FIG. 13 is a circuit diagram of the data flow during the program verifying operation shown in FIG. 12.

We now describe a program verifying operation when a selected memory cell fails programming. FIG. 12 is a timing diagram showing waveforms of signals and voltages at the nodes during the program verifying operation when a selected memory cell is detected as having failed programming (i.e., 'FAIL'). FIG. 13 illustrates a data flow in accordance with the verifying operation shown in FIG. 12.

Referring to FIG. 12, in a data drawing-out period P2A, the sensing precharge signal /PRSEN is set to a logic "L" to precharge the sensing node NSEN to the power source voltage VCC. During this time, the main latch data bit MLD is at a logic "H." As a selected memory cell is conditioned in the FAIL program state, the bitline BLe or BLo corresponding thereto forms a current path toward the ground voltage VSS.

In a data flipping period P2B, when the bitline shielding signal BLSHF changes to a logic "H," the sensing node NSEN goes to the ground voltage VSS. During this time, if the read latch signal RLAT and main latch setting signal MLSET become logic "H," the main latch node NLAM does not flip, maintaining a logic "H" (refer to ① shown in FIG. 13). Thereafter, if the node N251 goes to a logic "L," the internal output line IDOUT is driven into the ground voltage VSS (refer to ② shown in FIG. 13).

In the wired-OR period P2C, if the wired-OR enable signal /WOREN is set to a logic "L," the global output line GDOUT keeps a discharged state of logic "L." As such, from finding the global output line GDOUT is laid on logic "L," it verifies that at least one of the memory cells MC has failed programming and is in the FAIL state.

Accordingly, the program verifying operation is implemented as a wired-OR scheme concurrently verifying all the data bits of plural programmed memory cells significantly reducing the operation time.

As described above, an embodiment of the nonvolatile memory device comprises an internal output line and a data line control circuit. The internal output line is conductive by each output driver of each page buffer, being set on a ground voltage whenever one of main latch data bits of the page buffers is a logic "H", independent of the logic states of the main latch data bits in the rest of the page buffers. The data line control circuit continuously supplies a predetermined current to the global output line after discharging the same. It is possible to read data for program verification in the pattern of wired-OR, remarkably reducing the time for program verification. In particular, an embodiment of the memory device reduces peak current during the wired-OR operation.

We have described various embodiments illustrated in the accompanying drawings. It will be apparent to those skilled in

I claim the following:

1. A nonvolatile semiconductor memory device comprising:
    a memory cell array including a plurality of bitlines and a plurality of memory cells, each memory cell adapted to store data responsive to a corresponding bitline;
    a plurality of page buffers, each page buffer adapted to buffer main latch data responsive to the data in the bitlines;
    an internal output line directly coupled with a wired-OR structure to the plurality of the page buffers;
    an output switch circuit to couple the internal output line to an global output line during a wired-OR mode; and
    a data line control circuit to supply a charge current to the global output line after discharging the global output line during the wired-OR mode responsive to a wired-OR enable signal.

2. The nonvolatile semiconductor memory device of claim 1 where the data line control circuit comprises:
    a data line discharge block to discharge the global output line; and
    a data line charge block to charge the global output line responsive to its discharge by the data line discharge block.

3. The nonvolatile semiconductor memory device of claim 2
    where the data line discharge block is adapted to discharge the global output line to a ground voltage; and
    where the data line charge block includes:
        a data line charger to supply a charge current to the global output line responsive to a data line charge signal; and
        a charge controller to generate the data line charge signal and to control the data line charger regulating the charge current to be insensitive to process condition variations.

4. The nonvolatile semiconductor memory device of claim 3
    where the data line charger includes a first PMOS transistor gated by the data line charge signal; and
    where the charge controller includes:
        a second PMOS transistor connected between a power source voltage and the data line charge signal and gated by the data line charge signal; and
        a first NMOS transistor connected between the data line charge signal and the ground voltage and gated by a data line reference voltage.

5. The nonvolatile semiconductor memory device of claim 4 where the charge controller comprises:
    a second NMOS transistor serially connected between the second PMOS transistor and the first NMOS transistor and gated by a charge control signal; and
    a third PMOS transistor to regulate the data line charge signal and gated by the charge control signal.

6. The nonvolatile semiconductor memory device of claim 1 further comprising a data line latch circuit to latch a data bit of the global output line.

7. The nonvolatile semiconductor memory device of claim 6 where the data line latch circuit comprises:
    a global line latch block to latch a data bit of the global output line and to provide the latched data bit from the global output line to a common output line responsive to the wired-OR enable signal; and
    a common latch block to latch a data bit of the common output line responsive to the wired-OR enable signal.

8. The nonvolatile semiconductor memory device of claim 1 where each page buffer includes:
    a main latch block to store main latch data in a main latch node responsive to a main latch set signal; and
    an output driver coupled to the main latch block to make the internal output line conductive in a unilateral direction in correspondence with the main latch data;
    where the internal output line transfers an external data bit electrically isolated from an input data path.

9. A nonvolatile semiconductor memory device comprising:
    a memory cell array including a plurality of bitlines and a plurality of memory cells to store data;
    a plurality of page buffers to buffer main latch data responsive to the bitlines;
    an internal output line directly coupled with a wired-OR structure to the plurality of the page buffers;
    a global output line to transfer a data bit responsive to the internal output line;
    an output switch circuit to electrically connect the global output line to the internal output line during a wired-OR mode; and
    a data line control circuit to charge the global output line with a charge current after discharging the same during the wired-OR mode responsive to a wired-OR enable signal.

10. The nonvolatile semiconductor memory device of claim 9 further comprising a data line latch circuit to latch a data bit of the global output line.

11. The nonvolatile semiconductor memory device of claim 10 where the data line latch circuit comprises:
    a global line latch block to latch a data bit of the global output line and to provide the latched data bit from the global output line to a common output line responsive to the wired-OR enable signal; and
    a common latch block to latch a data bit of the common output line responsive to the wired-OR enable signal.

12. The nonvolatile semiconductor memory device of claim 9 where the data line control circuit comprises:
    a data line discharge block to discharge the global output line; and
    a data line charge block to charge the global output line responsive to the data line discharge block.

13. The nonvolatile semiconductor memory device of claim 12
    where the data line discharge block is adapted to discharge the global output line to a ground voltage; and
    where the data line charge block includes:
        a data line charger to supply the charge current to the global output line responsive to a data line charge signal; and
        a charge controller to generate the data line charge signal and to control the data line charger.

14. The nonvolatile semiconductor memory device of claim 13
    where the data line charger includes a first PMOS transistor gated by the data line charge signal; and
    where the charge controller includes:
        a second PMOS transistor connected between a power source voltage and the data line charge signal and gated by the data line charge signal; and
        a first NMOS transistor connected between the data line charge signal and the ground voltage and gated by a data line reference voltage.

15. The nonvolatile semiconductor memory device of claim 14 where the charge controller comprises:
   a second NMOS transistor serially connected between the second PMOS transistor and the first NMOS transistor and gated by a charge control signal; and
   a third PMOS transistor to regulate the data line charge signal and gated by the charge control signal.

16. The nonvolatile semiconductor memory device of claim 15 where the output switch includes a logic gate to logically manipulate the wired-OR enable signal with a block decoding signal.

17. A nonvolatile semiconductor memory device comprising:
   a memory cell array including a plurality of bitlines and a plurality of memory cells structured to store data;
   a plurality of page buffers structured to buffer main latch data responsive to the bitlines;
   an internal output line directly coupled with a wired-OR structure to the plurality of the page buffers;
   a global output line structured to transfer a data bit responsive to the internal output line;
   an output switch circuit electrically coupled to the global output line and the internal output line during a wired-OR mode; and
   a data line control circuit structured to discharge the global output line during a data line discharge period during a wired-OR mode responsive to a wired-OR enable signal.

18. The nonvolatile semiconductor memory device of claim 17, where each of the plurality of page buffers includes:
   a main latch circuit structured to latch the main latch data; and
   an output driver including an NMOS transistor, a gate of the NMOS transistor coupled to the main latch circuit, a terminal of the NMOS transistor directly coupled to a ground voltage.

19. The nonvolatile semiconductor memory device of claim 18, where the NMOS transistor comprises a first NMOS transistor and the terminal comprises a first terminal, and wherein a second terminal of the first NMOS transistor is coupled to the internal output line via a second NMOS transistor.

20. The nonvolatile semiconductor memory device of claim 17 further comprising:
   a global line latch block structured to latch the data bit of the global output line and to provide the latched data bit from the global output line to a common output line responsive to the wired-OR enable signal.

21. The nonvolatile semiconductor memory device of claim 20 further comprising:
   a common latch block electrically coupled to the global line latch block and structured to latch a data bit of the common output line responsive to the wired-OR enable signal.

22. The nonvolatile semiconductor memory device of claim 17 where the data line control circuit comprises:
   a data line discharge block structured to discharge the global output line to a ground voltage; and
   a data line charge block structured to charge the global output line responsive to the data line discharge block, the data line charge block including:
      a data line charger including a first PMOS transistor gated by a data line charge signal; and
      a charge controller including a second PMOS transistor connected between a power source voltage and the data line charge signal and gated by the data line charge signal.

23. The nonvolatile semiconductor memory device of claim 22 where the charge controller comprises:
   a first NMOS transistor connected between the data line charge signal and the ground voltage and gated by a data line reference voltage;
   a second NMOS transistor serially connected between the second PMOS transistor and the first NMOS transistor and gated by a charge control signal; and
   a third PMOS transistor structured to regulate the data line charge signal and gated by the charge control signal.

24. The nonvolatile semiconductor memory device of claim 17 where the output switch includes a logic gate to logically manipulate the wired-OR enable signal with a block decoding signal.

* * * * *